(12) United States Patent
Sharma

(10) Patent No.: US 11,429,441 B2
(45) Date of Patent: Aug. 30, 2022

(54) WORKFLOW SIMULATOR

(71) Applicant: Bank of America Corporation, Charlotte, NC (US)

(72) Inventor: Anirudh Kumar Sharma, Gurugram (IN)

(73) Assignee: Bank of America Corporation, Charlotte, NC (US)

( * ) Notice: Subject to any disclaimer, the term of this patent is extended or adjusted under 35 U.S.C. 154(b) by 536 days.

(21) Appl. No.: 16/686,726

(22) Filed: Nov. 18, 2019

(65) Prior Publication Data

US 2021/0149999 A1    May 20, 2021

(51) Int. Cl.
*G06F 9/46* (2006.01)
*G06F 9/50* (2006.01)

(52) U.S. Cl.
CPC ...... *G06F 9/5005* (2013.01); *G06F 2209/501* (2013.01)

(58) Field of Classification Search
None
See application file for complete search history.

(56) References Cited

U.S. PATENT DOCUMENTS

| | | | |
|---|---|---|---|
| 6,449,641 B1 | 9/2002 | Moiin et al. | |
| 7,165,189 B1 | 1/2007 | Lakkapragada et al. | |
| 7,610,186 B2 * | 10/2009 | Odhner | G06F 11/3433 702/182 |
| 8,949,305 B1 | 2/2015 | White | |
| 9,031,925 B2 | 5/2015 | Gardella et al. | |
| 9,104,651 B1 | 8/2015 | White et al. | |
| 9,223,845 B2 | 12/2015 | Horn | |
| 9,244,751 B2 | 1/2016 | Cherkasova et al. | |
| 9,262,216 B2 | 2/2016 | Bodik et al. | |
| 9,348,569 B1 | 5/2016 | Chopra et al. | |
| 9,367,601 B2 | 6/2016 | Babu et al. | |
| 9,727,355 B2 | 8/2017 | Holler et al. | |
| 9,891,959 B2 | 2/2018 | Li et al. | |
| 9,934,071 B2 | 4/2018 | Gupta et al. | |
| 10,019,287 B1 | 7/2018 | Loughmiller | |

(Continued)

FOREIGN PATENT DOCUMENTS

WO    WO 2017/205317    11/2017

OTHER PUBLICATIONS

U.S. Appl. No. 16/686,775, filed Nov. 18, 2019, Sharma.

*Primary Examiner* — Bing Zhao

(57) ABSTRACT

A system includes a production cluster with a first plurality of nodes. The production cluster executes a workload. Jobs associated with the workload are allocated, according to a first configuration, across the first plurality of nodes. A workload simulator is coupled to the production cluster and a test cluster. The workload simulator extracts production cluster data, which includes production capability information, workload data, and production cluster usage information, as well as test capability information. The workload simulator determines a first job type to include in a simulated workload to be executed on the test cluster and a number of jobs of the first job type to include in the simulated workload. The system also includes a test cluster which includes a second plurality of nodes. The second plurality of nodes includes fewer nodes than does the first plurality of nodes. The test cluster executes the simulated workload.

20 Claims, 9 Drawing Sheets

(56) References Cited

U.S. PATENT DOCUMENTS

| | | |
|---|---|---|
| 10,073,641 B2 | 9/2018 | Bish et al. |
| 10,073,880 B2 | 9/2018 | Li et al. |
| 10,102,098 B2 | 10/2018 | Yeh et al. |
| 10,176,092 B2 | 1/2019 | Alcantara et al. |
| 10,210,221 B2 | 2/2019 | Murthy et al. |
| 10,217,061 B2 | 2/2019 | Hayes et al. |
| 10,455,028 B2 | 10/2019 | Baxter |
| 2002/0161867 A1 | 10/2002 | Cochran et al. |
| 2003/0023680 A1 | 1/2003 | Shirriff |
| 2005/0114515 A1 | 5/2005 | Droms |
| 2007/0263546 A1 | 11/2007 | Chowdhury et al. |
| 2010/0332904 A1 | 12/2010 | Bloching et al. |
| 2014/0115282 A1 | 4/2014 | Natkovich et al. |
| 2014/0122546 A1 | 5/2014 | Liao et al. |
| 2015/0006966 A1* | 1/2015 | Dimitrovich ........... H04L 67/01 714/38.14 |
| 2015/0066646 A1 | 3/2015 | Sriharsha et al. |
| 2016/0350146 A1 | 12/2016 | Udupi et al. |
| 2017/0063627 A1 | 3/2017 | Viswanathan et al. |
| 2017/0302586 A1 | 10/2017 | Suchter et al. |
| 2017/0316094 A1 | 11/2017 | Shekhar |
| 2018/0121336 A1 | 5/2018 | Ayyappan et al. |
| 2018/0203744 A1 | 7/2018 | Wiesmaier et al. |
| 2018/0246754 A1 | 8/2018 | Fuchs |
| 2019/0138345 A1 | 5/2019 | Singh et al. |
| 2019/0205173 A1 | 7/2019 | Gupta et al. |
| 2019/0227842 A1 | 7/2019 | Qiu et al. |
| 2019/0266154 A1 | 8/2019 | Wu et al. |
| 2019/0294509 A1 | 9/2019 | Bharadwaj et al. |

* cited by examiner

WORKLOAD SIMULATOR WORKFLOW

Production Cluster Hardware Capabilities 302

| Seq Number | Number of CPU | Number of Nodes | Disk Storage | RAM Memory | Network Bandwidth |
|---|---|---|---|---|---|
| 1 | 5000 | 500 | 1000 TB | 125 TB | 10 Gbps |

Production Cluster Usage Over Time 304

| Date and Time | Maximum CPU Usage | Disk Usage During Job Execution | Maximum Memory Usage | Maximum Network Usage |
|---|---|---|---|---|
| 12:00 am | 60% | 50% | 60% | 40% |
| 12:05 am | 50% | 50% | 50% | 50% |
| 12:10 am | 70% | 50% | 70% | 40% |
| 12:15 am | 60% | 50% | 60% | 40% |
| 12:20 am | 60% | 50% | 60% | 40% |
| 12:25 am | 40% | 50% | 40% | 50% |
| 12:30 am | 30% | 50% | 30% | 60% |

Job Wise Usage 306

| Date and Time | Work Load Type | CPU Consumption | Disk-Input/Output-Read | Disk-Input/Output-Write | Disk-Input/Output-Interim | Memory Consumption | Network Bandwidth |
|---|---|---|---|---|---|---|---|
| 12:00 am | Map Reduce | 15% | 5% | 10% | 15% | 15% | 15% |
| 12:00 am | Spark | 25% | 5% | 5% | 5% | 25% | 15% |
| 12:00 am | Impala | 10% | 10% | 5% | 10% | 10% | 10% |
| 12:00 am | Sqoop | 10% | 10% | 10% | 15% | 10% | 10% |
| 12:05 am | Map Reduce | 15% | 15% | 25% | 5% | 15% | 15% |
| 12:05 am | Spark | 15% | 5% | 10% | 5% | 45% | 10% |
| 12:05 am | Impala | 10% | 5% | 5% | 3% | 20% | 10% |
| 12:05 am | Sqoop | 10% | 5% | 5% | 2% | 20% | 15% |

*FIG. 3A*

WORKLOAD SIMULATOR WORKFLOW

Test Cluster Capabilities 352

| Seq Number | Number of CPU | Number of Nodes | Disk Storage | RAM Memory | Network Bandwidth |
|---|---|---|---|---|---|
| 1 | 500 | 50 | 100 TB | 10 TB | 10 Gbps |

Test Cluster Calculated Load 354

| Date and Time | Maximum CPU Usage | Disk Usage During Job Execution | Maximum Memory Usage | Maximum Network Usage |
|---|---|---|---|---|
| 12:00 am | 60% → (300) | 50% → (50 TB) | 60% → (6 TB) | 40% → 4 Gbps |
| 12:05 am | 50% → (250) | 50% → (50 TB) | 50% → (5 TB) | 50% → 5 Gbps |
| 12:10 am | 70% → (350) | 50% → (50 TB) | 70% → (7 TB) | 40% → 4 Gbps |
| 12:15 am | 60% → (300) | 50% → (50 TB) | 60% → (6 TB) | 40% → 4 Gbps |
| 12:20 am | 60% → (300) | 50% → (50 TB) | 60% → (6 TB) | 40% → 4 Gbps |
| 12:25 am | 40% → (200) | 50% → (50 TB) | 40% → (4 TB) | 50% → 5 Gbps |
| 12:30 am | 30% → (150) | 50% → (50 TB) | 30% → (3 TB) | 60% → 6 Gbps |

Job-Wise Resource Consumption 356

| Date and Time | Work Load Type | CPU Consumption | Disk-Input/Output-Read | Disk-Input/Output-Write | Disk-Input/Output-Interim | Memory Consumption | Network Bandwidth |
|---|---|---|---|---|---|---|---|
| 12:00 am | Map Reduce | 15% → (75) | 5% → (5 TB) | 10% → (10 TB) | 15% → (15 TB) | 15% → (1.5 TB) | 15% → 1.5 Gbps |
| 12:00 am | Spark | 25% → (125) | 5% → (5 TB) | 5% → (5 TB) | 5% → (5 TB) | 25% → (2.5 TB) | 15% → 1.5 Gbps |
| 12:00 am | Impala | 10% → (50) | 10% → (10 TB) | 5% → (5 TB) | 10% → (10 TB) | 10% → (1 TB) | 10% → 1 Gbps |
| 12:00 am | Sqoop | 10% → (50) | 10% → (10 TB) | 5% → (5 TB) | 15% → (15 TB) | 10% → (1 TB) | 10% → 1 Gbps |
| 12:05 am | Map Reduce | 15% → (75) | 10% → (10 TB) | 10% → (10 TB) | 5% → (5 TB) | 15% → (1.5 TB) | 15% → 1.5 Gbps |
| 12:05 am | Spark | 15% → (75) | 15% → (15 TB) | 25% → (25 TB) | 5% → (5 TB) | 45% → (4.5 TB) | 10% → 1 Gbps |
| 12:05 am | Impala | 10% → (50) | 5% → (5 TB) | 10% → (10 TB) | 3% → (3 TB) | 20% → (2 TB) | 10% → 1 Gbps |
| 12:05 am | Sqoop | 10% → (50) | 5% → (5 TB) | 5% → (5 TB) | 2% → (2 TB) | 20% → (2 TB) | 15% → 1.5 Gbps |

WORKFLOW SIMULATOR

TECHNICAL FIELD

The present disclosure relates generally to production clusters, and more particularly to a workflow simulator.

BACKGROUND

A production cluster refers to a collection of servers, or nodes, which are coupled together to perform a common computing task. A production cluster may include resources for the storage and analysis of data. There exists a need for improved systems and methods for operating production clusters.

SUMMARY

A production cluster may be employed to execute a variety of job types. Production clusters used to run these jobs may include hundreds or thousands of nodes. Each job generally includes a set of subtasks which in combination correspond to performing a primary task such as analyzing a dataset, executing a program, or the like. The collection of jobs executed by a production cluster is referred to as a workload. Each job of a workload may involve the consumption of different computing resources of the production cluster. For example, one job may consume more processing resources, while other jobs may consume more network bandwidth or memory. Using conventional tools, it is difficult or impossible to appropriately tune how different job tasks are allocated amongst the nodes of the production cluster. For instance, even if the production cluster is tuned to improve a single job (e.g., by allocating memory, processing resources, etc. to the job), previous technology was unable to account for how changes affected during tuning of this job might impact the performance of other jobs being executed on the production cluster. Accordingly, previous technology for testing and tuning a production cluster may result in an overall decrease in cluster performance.

In one embodiment, a system includes a production cluster which includes a first plurality of nodes. The production cluster executes a workload, where jobs associated with the workload are allocated, according to a first configuration, across the first plurality of nodes. The system also includes a workload simulator, which is coupled to the production cluster and a test cluster. The workload simulator is implemented using a processor. The processor is configured to extract production cluster data from the production cluster. The production cluster data includes production capability information, which includes a record of computing resources associated with the nodes of the production cluster. The production cluster data includes workload data, which includes a record of the jobs associated with the workload. The production cluster data includes production cluster usage information, which includes a record of usage, over time, of the computing resources associated with the nodes of the production cluster by the jobs associated with the workload. The workload simulator also extracts, from the test cluster, test capability information, which includes a record of computing resources available to the test cluster. The workload simulator determines, based at least in part on the production cluster data, a first job type to include in a simulated workload to be executed on the test cluster. The workload simulator determines, based at least in part on the production capability information and the test capability information, a number of jobs of the first job type to include in the simulated workload. The workload simulator generates the simulated workload, which includes the determined number of jobs of the first job type. The system also includes a test cluster which includes a second plurality of nodes. The second plurality of nodes includes fewer nodes than does the first plurality of nodes. The test cluster executes the simulated workload.

In another embodiment, a system includes a production cluster which includes a first plurality of nodes. The production cluster executes a workload, such that jobs associated with the executed workload are allocated, according to a first configuration, across the first plurality of nodes. A cluster monitor is coupled to the production cluster and extracts production cluster information from the production cluster. The production cluster information includes a record of the computing resources associated with the first plurality of nodes of the production cluster and a record of the jobs associated with the workload. The cluster monitor monitors configuration information during execution of the workload. The configuration information corresponds to how jobs of the workload are allocated amongst the computing resources associated with the first plurality of nodes of the production cluster. The cluster monitor transmits the production cluster information and configuration information to a cluster tuner. The cluster tuner is coupled to the cluster monitor and a test cluster. The test cluster includes a second plurality of nodes that is less than the first plurality of nodes of the production cluster. The cluster tuner is implemented by a second processor. The second processor is configured to receive the production cluster information and configuration information. The second processor of the cluster tuner determines, based at least in part on the received production cluster information and configuration information, a first recommended configuration for the production cluster. The second processor of the cluster tuner causes the test cluster to execute a simulated workload according to the first recommended configuration. The simulated workload reflects a scaled-down version of the workload of the production cluster. The second processor of the cluster tuner determines changes in resource consumption caused by execution of the simulated workload after executing the simulated workload according to the first recommended configuration. In response to determining that the first recommended configuration results in a decrease in resource consumption, the second processor of the cluster tuner transmits instructions configured to cause the production cluster to operate according to the first recommended configuration.

The systems described in the present disclosure provide technical solutions to the technical problems of previous systems, including those described above, by facilitating more efficient and reliable production cluster operation via a unique workload simulator and cluster tuner. The disclosed systems and methods provide several advantages which include, for example, 1) improved cluster performance evaluation using a scaled-down test cluster executing a simulated workload which uniquely reflects the operating conditions of the production cluster, 2) efficient tuning of clusters via more effective allocation of computing resources to jobs in a workload, and 3) the ability to proactively adapt resource allocation in response to changes in the workload executed by a cluster. As such, the systems described in the present disclosure may improve the function of computer systems used for testing and/or tuning production clusters. For instance, the systems may determine an appropriate amount of memory, processing capacity, and network bandwidth to allocate to each job such that these computing resources are not wasted and such that one job is not improved (e.g., by facilitating faster execution of the job) at the detriment to other jobs in the workload. This allows the computing resources of the various nodes of a production cluster to be used more efficiently such that fewer nodes may be required to execute a given number of jobs (e.g., or such that more jobs can be executed on the same number of nodes), thereby reducing the cost, complexity, and power consumption associated with operating the production cluster. The systems and methods may also reduce or eliminate technological bottlenecks to performing jobs in a cluster environment, because the clusters' computing resources (e.g., memory, processing resources, network bandwidth, and the like) may be used more efficiently. The systems described in the present disclosure may be integrated into a variety of practical applications for operating production clusters, for example, in order to analyze large data sets using a variety of analytical tools with different computing needs.

Certain embodiments of the present disclosure may include some, all, or none of these advantages. These advantages and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

FIGS. 3A and 3B are tables of example data used by the cluster environment system of FIG. 1;

DETAILED DESCRIPTION

As described above, prior to the present disclosure, there was a lack of tools for efficiently and reliably testing and tuning production clusters. As described with respect to illustrative examples of FIGS. 1-7 below, the present disclosure facilitates improved testing of a production cluster using a unique workload simulator, which facilitates testing of a simulated workload which reflects the workload that is actually executed by the production cluster and the conditions under which the workload is executed. The present disclosure also facilitates improved tuning of a production cluster using a specially trained cluster tuner, which accounts for how changes to the allocation of resources amongst different jobs of a workload impacts the overall performance of the production cluster in order to reliably tune the production cluster. These features facilitate the efficient operation of a production cluster under a variety of different operating conditions.

As used in this disclosure, a "job" generally refers to a computing task performed using a cluster. For example, a job may correspond to a set of calculations performed on a cluster, a program executed on a cluster, or the like. Each job may involve a set of tasks which may be executed by different nodes of a production cluster. As a non-limiting example, jobs may be associated with performing computing tasks using a variety of cluster-computing applications, software, and/or frameworks such as Apache Spark, Apache Sqoop, Apache Impala, and the like. A "workload" generally refers to the set of jobs performed by a cluster. For instance, a workload may include tens, hundred, or thousands of jobs.

Cluster Environment

Figure 1:
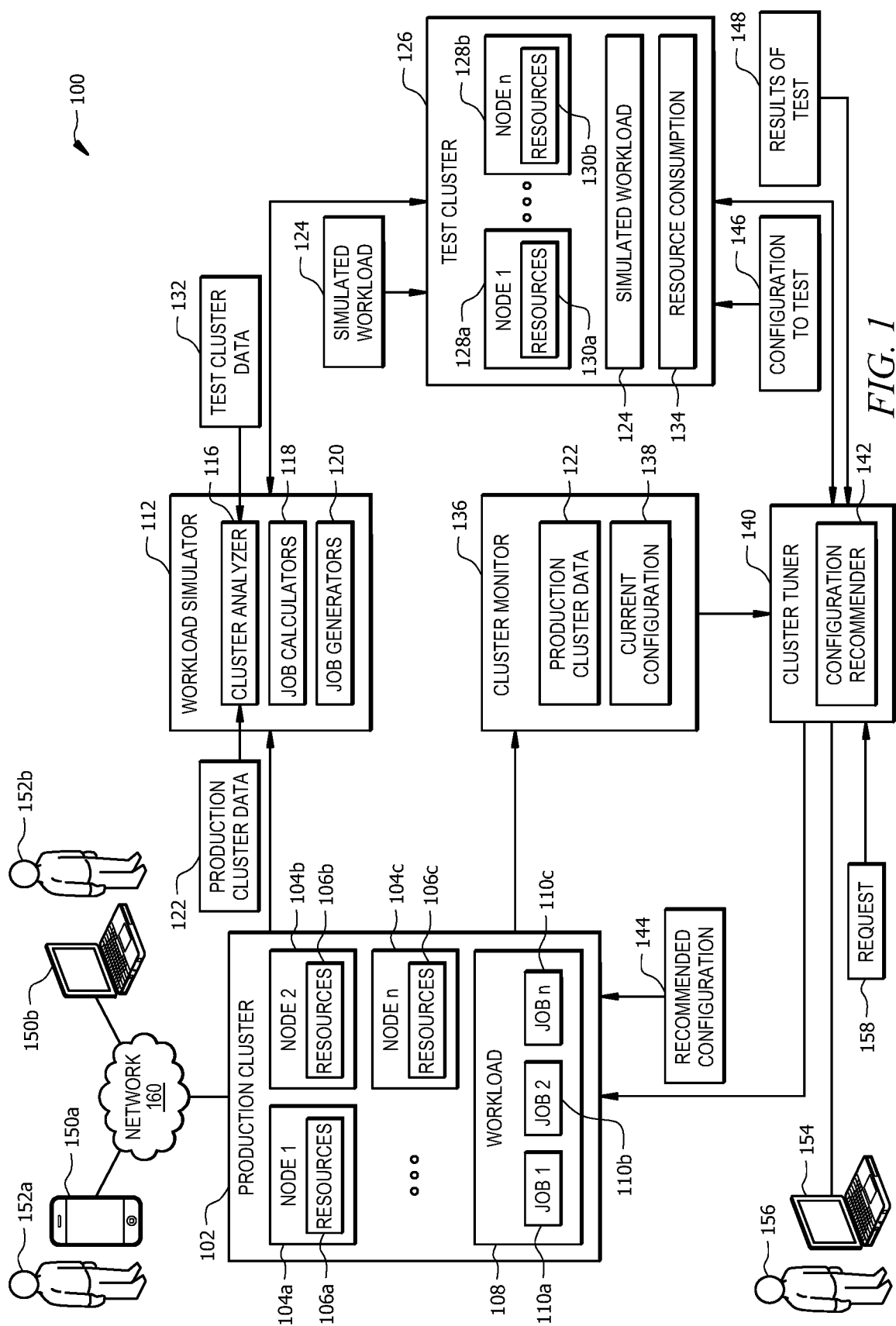
FIG. 1 is a schematic diagram of an example cluster environment system.

FIG. 1 illustrates an example cluster environment system 100. Cluster environment system 100 includes a production cluster 102, a workload simulator 112, a test cluster 126, a cluster monitor 136, a cluster tuner 140, user devices 150a-b, and administrator device 154. In general, each of the workload simulator 104 and cluster tuner 126 facilitate improved performance of the production cluster 102 by facilitating the more efficient allocation of jobs 110a-c amongst resources 106a-c of the various nodes 104a-c of the production cluster 102, as described in greater detail below.

For example, the workload simulator 104 may generate a simulated workload 124, which represents a scaled-down version of the actual workload 108 being run on the production cluster 102 and can be run for testing purposes on the test cluster 126. When the simulated workload 124 is run on the test cluster 126 the behavior of the test cluster 126 more accurately reflects that of the production cluster 102 than was possible using previous technology. As another example, the cluster tuner 126 generally uses information about the production cluster 102 (e.g., provided via the cluster monitor 136) to generate recommended configurations 144 (e.g., recommendations for how jobs 110a-c should be allocated amongst resources 106a-c). In some cases, the recommended configurations 144 from the cluster tuner 140 may be provided to the test cluster 126 to verify whether the recommendations 144 will improve performance of the production cluster 102 before they are implemented in the production cluster 102. In some embodiments, the simulated workload 124 generated by the workload simulator 112 may be used to improve this testing of recommended configurations 144 (e.g., by providing improved training data for establishing the configuration recommender 142—see, e.g., FIG. 6 and corresponding description below). The cluster environment system 100 may be configured as shown or in any other suitable configuration.

The production cluster 102 generally includes a plurality of nodes 104a-c (e.g., servers) and is configured to execute a workload 108. Each node 104a-c may be a server or any appropriate computing device or collection of computing devices. For instance, each node 104a-c may be implemented using hardware, memory, and interface of device 800. As such, resources 106a-c may be associated with the memory, processor, and interface of device 800. Workload 108 may include any number of jobs 110a-c. The computational tasks associated with jobs 110a-c are generally distributed across nodes 104a-c, such that the resources 106a-c of each node 104a-c perform a subset of the tasks. Resources 106a-c include the memory, processing resources (e.g., related to CPU usage), network bandwidth, and the like of the corresponding nodes 104a-c.

The workload simulator 112 is generally a device (e.g., a server or any other appropriate computing device or collection of computing devices) configured to generate a simulated workload 124 to run on the test cluster 126 in order to replicate a close approximation of the operating conditions of the production cluster 102. The workload simulator 112 may be implemented using the hardware, memory, and interface of device 800 described with respect to FIG. 8 below. The workload simulator 112 includes a cluster analyzer 116, one or more job calculators 118, and one or more job generators 120, each of which are described in greater detail below with respect to FIG. 2.

In brief, the cluster analyzer 116 of the workload simulator 112 analyzes the production cluster data 122, which is received from or extracted from the production cluster 102. The production cluster data 122 generally includes information about the resources 106a-c available on each of the nodes 104a-c of the production cluster 102, the jobs 110a-c of the workload 108 executed on the production cluster 102, and the usage (e.g., over time and/or by the various jobs 110a0c) of the production cluster 102. For instance, the production cluster data 122 may include the number of nodes 104a-c in the production cluster 102, the number of processors (e.g., central processing units, or CPUs) in the production cluster 102, the disk storage space available in the production cluster 102, the volatile memory (e.g., random access memory, or RAM) available in the production cluster 102, and the network bandwidth of the production cluster 102.

If the production cluster 102 does not include a record of how resources are used by the production cluster 102 (e.g., if this information is not available in the production cluster data 122), the cluster analyzer 116 may determine this information. For instance, the cluster analyzer 116 may determine how resources 106a-c are used (e.g., or consumed) by the production cluster 102 over time (e.g., at different times of the day, week, month, or the like) and/or how resources 106a-c are used (e.g., or consumed) by different jobs 110a-c. This information may be added or appended to the production cluster data 122 when it is passed on to the job calculators 118 and job generators 120 of the workload simulator 112. The cluster analyzer 116 also receives and analyzes as appropriate test cluster data 132, which includes information about the computing capabilities of the test cluster 126 (e.g., of resources 130a-b). Data 122, 132 collected and determined by the cluster analyzer 116 is described in greater detail below with respect to FIGS. 2, 3A, and 3B.

Still referring to the workload simulator 112, the job calculators 118 generally determine appropriate jobs and the number of these jobs to include in the simulated workload 124. For instance, the job calculators 118 may determine certain job types to include in the simulated workload 124 (e.g., job types that are the same as or similar to those of the actual workload 108). The job calculators 118 then determine an appropriate number of jobs of each type to include in the simulated workload 124, such that that the proportion of resources 130a-b consumed during implementation of the simulated workload 124 is the same as or similar to (e.g., within about 10%) of the proportion of resources 106a-c consumed during execution of workload 108. In some embodiments, job calculators 118 employ machine learning models to identify appropriate jobs to include in the simulated workload 124 such that operating conditions of the test cluster 126 reflect a scaled-down version of those of the production cluster 102 (see, e.g., FIG. 4 and corresponding description below). Examples of job calculators 118 are described in greater detail below with respect to FIGS. 2 through 4. The job generators 120 generally use the calculated jobs from the job calculators 118 to generate the simulated workload 124 and cause the simulated workload 124 to be run on the test cluster 126. For instance, the job generators 120 may combine the jobs calculated by the job generators 118 to create the simulated workload 124, which may be provided to the test cluster 126 for execution. Examples of job generators 120 are described in greater detail below with respect to FIG. 2.

The test cluster 126 generally includes a plurality of nodes 128a-b (e.g., servers or any other appropriate computing device or collection of devices) and is configured to execute the simulated workload 124 generated by the workload simulator 112. The test cluster 126 generally represents a scaled-down version of the production cluster 102. For example, the test cluster may include ten times fewer nodes 128a-b than the number of nodes 104a-c of the production cluster 102. In general, the test cluster 126 may include any appropriate number of nodes 128a-b to facilitate reliable testing using simulated workload 124. Such a scaled-down test cluster 126 is generally more amendable to running tests, which would otherwise be impractical using the full-scale production cluster 102. The test cluster 126 also allows testing to be performed while the production cluster 102 is still in use (i.e., the production cluster does not have to be taken offline for testing). When the test cluster 126 is employed to execute the simulated workload 124, the test cluster 126 stores a record of resource consumption 134 during and/or after the test. This record of resource consumption 134 can be used to more reliably tune the production cluster 102 (e.g., by transmitting test results 146 to cluster tuner 140) than was possible using previous technology. The test cluster 126 may be implemented using the hardware, memory, and interface of device 800 described with respect to FIG. 8 below. For instance, each node 128a-b may be implemented using hardware, memory, and interface of device 800. As such, resources 130a-b may be associated with the memory, processor, and interface of device 800.

The cluster monitor 136 is generally any device (e.g., a server or any other appropriate computing device or collection of computing devices) configured to monitor properties of the production cluster 102 and how it is operated. For example, the cluster monitor 136 may monitor the workload 108 (i.e., which jobs 110a-c are executed by the production cluster 102) and the cluster data 122 (described above). The cluster monitor 136 may further monitor configuration information 138 of the production cluster 102. The cluster configuration information 138 generally includes information about how jobs 110a-c are allocated (e.g., distributed) amongst the resources 106a-c of nodes 104a-c of the production cluster 102. For example, configuration information 138 may describe how much memory, processing resources, and bandwidth are allocated to each of the jobs 110a-c. Any of this monitored information (e.g., including but not limited to cluster data 122 and/or cluster configuration information 138) may be transmitted to the cluster tuner 140. The cluster monitor 136 may be implemented using the hardware, memory, and interface of device 800 described with respect to FIG. 8 below.

The cluster tuner 140 is generally any device (e.g., a server or any other appropriate computing device or collection of computing devices) configured to tune the production cluster 102 by providing recommended configurations 144 to the production cluster 102. The cluster tuner 140 may be coupled to the cluster monitor 136, production cluster 102, and the test cluster 126, as shown in FIG. 1. The recommended configurations 144 generally correspond to an indication of how jobs 110a-c of workload 108 should be allocated amongst the resources 106a-c of the production cluster 102. Recommended configurations 144 are generated by the configuration recommender 142 of the cluster tuner 140 and generally facilitate more efficient execution of the workload 108 on the production cluster 102. In some embodiments, the recommendations 144 are provided to the test cluster (e.g., as adjustments 146) in order to verify, based on results 148, that intended performance improvements are achieved before the recommendations 144 are implemented at the production cluster 102. The cluster tuner may be implemented using the hardware, memory, and interface of device 800 described with respect to FIG. 8 below.

In some cases, the configuration recommender 142 may be configured based on information from the test cluster 126. For example, the cluster tuner may provide adjustments 146 to implement to the configuration of the test cluster 126 (e.g., changes to how a simulated workload 124 is distributed amongst resources 130a-b) and use the results 148 of the adjustment 146 (e.g., changes in resource consumption data 134 resulting from adjustments 146) to update the configuration recommender 142. In some embodiments, the results 148 may be used as training data to train a machine learning model used to implement functions of the configuration recommender 142. Examples of the cluster tuner 140 and its operation are described in greater detail with respect to FIGS. 6 and 7 below.

User devices 150a-b may be any appropriate computing devices (e.g., computers, smartphones, or the like) configured to run jobs 110a-c on the production cluster 102. For example, a first user 152a may operate a first device 150a (e.g., a smartphone) to setup first job 110a to run on the production cluster 102, and a second user 152b may operate a second device 150b (e.g., a personal computer) to setup second job 110b to run on the production cluster 102. For example, each of the users 152a-b may be provided access to a shared dataset to analyze using the production cluster 102. Each user 152a-b may have different analysis goals and, thus, may run different job types on the production cluster 102. For clarity and conciseness, only two users 150a-b and two user devices 152-b are illustrated in the example of FIG. 1. However, it should be understood that any number of users 150a-b and user devices 152a-b may have access to the production cluster 102.

Administrator device 154 may be any appropriate computing device (e.g., computer, smartphone, or the like) configured to communicate with the cluster tuner 140. The device 154 generally facilitates tuning of the production cluster 102 by an administrator 156 using the cluster tuner 140. For instance, the administrator 156 may transmit a tuning request 158 from device 154 to the cluster tuner 140, as described in greater detail below. In some embodiments, the administrator 156 can input the request 158 into the cluster tuner 140 (e.g., without a separate device 154). In other words, the cluster tuner 140 may include an appropriate interface for inputting the request 158 such that a separate administrator device 154 may not be necessary or may be optional.

Communication between and amongst the various components of the cluster environment system 100 may be conducted over a network 160. For instance, the network 160 may communicatively couple at least the user devices 150a-b to the production cluster 102, as shown in the example of FIG. 1. The network 160 (e.g., or a similar network) may provide communication between and amongst the other components of the cluster environment system 100. This disclosure contemplates such a network 160 being any suitable network operable to facilitate communication between the components of the system 100. The network may include any interconnecting system capable of transmitting audio, video, signals, data, messages, or any combination of the preceding. The network 160 may include all or a portion of a public switched telephone network (PSTN), a public or private data network, a local area network (LAN), a metropolitan area network (MAN), a wide area network (WAN), a local, regional, or global communication or computer network, such as the Internet, a wireline or wireless network, an enterprise intranet, or any other suitable communication link, including combinations thereof, operable to facilitate communication between the components.

In an example operation of the cluster environment system 100, one or more of the users 152a-b may configure jobs 110a-c to execute on the production cluster 102. For instance, the first user 152a may request to execute a first job 110a on the production cluster 102, and the second user 152b may request to execute a second job 110b on the production cluster 102. Following addition of jobs 110a-b to the workload 108, production cluster data 122 may be provided to the workload simulator 112. For instance, the production cluster data 122 may be transmitted automatically by the production cluster 102 in response to the changes to the workload 108. In some cases, the cluster analyzer 116 may monitor the workload 108 and extract the cluster data 122 in response to detected changes to the workload 108. In other cases, an administrator 156 overseeing operation of the production cluster 102 may wish to improve the cluster's performance and, thus, may cause the production cluster data 122 to be provided to the workload simulator 112 to initiate generation of a simulated workload 124 for testing.

Following receipt of the production cluster data 122, the workload simulator 112 generates a simulated workload 124 to run on the test cluster 126. The simulated workload 124 reflects the current workload 108 (e.g., based on changes input by a user 152a-b) and generally enables the test cluster 126 to accurately reflect how changes in the configuration of the production cluster 102 (e.g., changes to how jobs 110a-c are allocated amongst resources 106a-c) will affect the overall performance of the cluster 102. Accordingly, changes which may improve the performance of one or a few of the jobs 110a-c but would otherwise diminish the overall performance of the production cluster 102 can be avoided. Once beneficial adjustments to the configuration of the test cluster 126 are identified, analogous changes may be implemented in the production cluster 102. For instance, if increasing the memory allocated to a first job of the simulated workload 124 improves the performance of test cluster 126, more memory may be allocated to a corresponding first job 110a-c of the production cluster 102. Other examples of the workload simulator 112 and its operation are described below with respect to FIGS. 2-6.

In another example operation of the cluster environment system 100, an administrator 156 may wish to tune the production cluster 102 (e.g., to more efficiently allocate jobs 110a-c of the workload 108 amongst the resources 106a-c, as described above). As such, the administrator 156 sends a tuning request 158 to the cluster tuner 140. After receiving the request 158, the cluster tuner 140 collects information (e.g., the cluster data 122 and configuration information 138) about the production cluster 102 from the cluster monitor 102 and uses this information to generate a new recommended configuration 144 for the production cluster 102. In some cases, the recommended configuration 144 may first be tested on the test cluster 126 to verify that it is likely to improve the performance of the production cluster 102. After the recommended configuration 144 is implemented by the production cluster 102, the cluster monitor 136 may continue to monitor the performance of the production cluster 102 to ensure that unexpected decreases in performance do no occur. If the cluster monitor 136 detects a decrease in cluster performance, the production cluster 102 may determine an alternative configuration or revert to its previous configuration. Other examples of the cluster tuner 140 and its operation are described below with respect to FIGS. 6 and 7.

Workload Simulator

Figure 2:
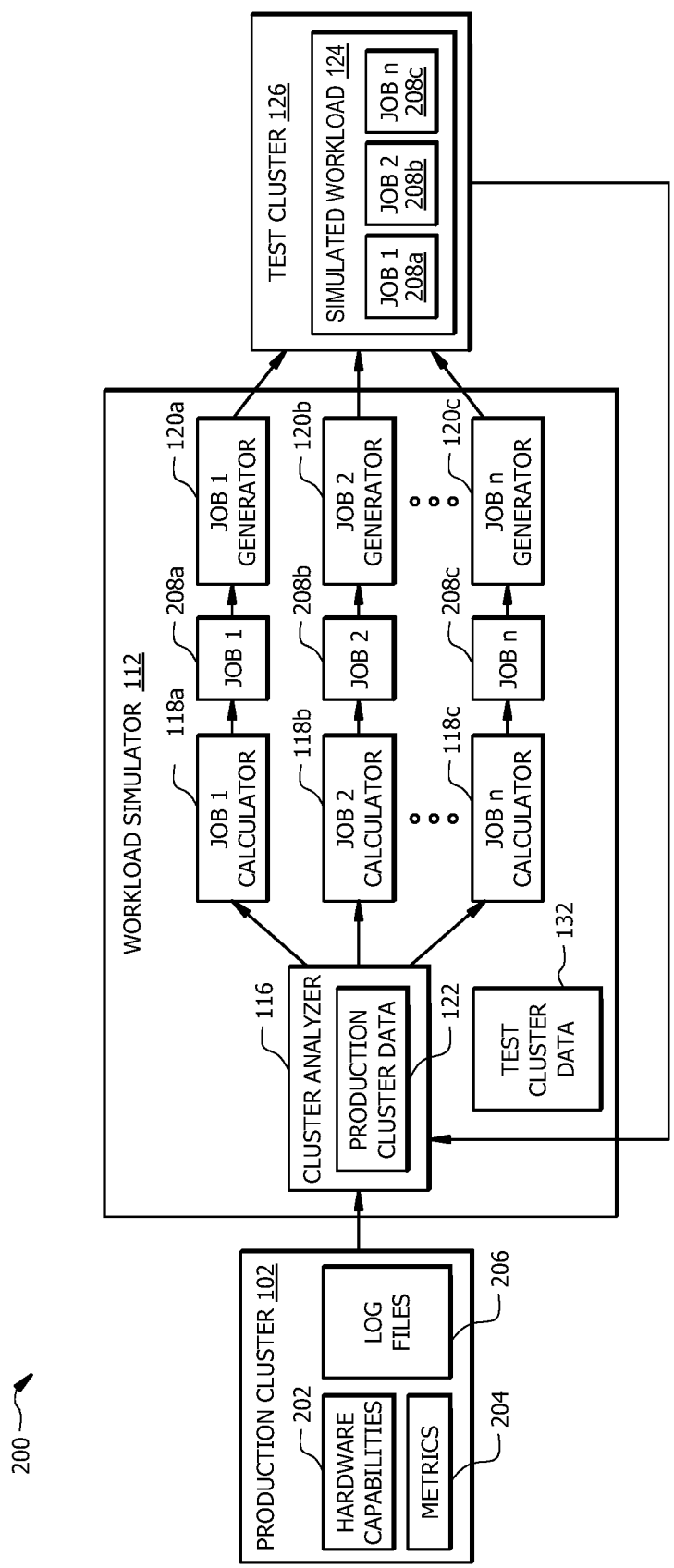
FIG. 2 is a diagram illustrating an example workload simulator of the cluster environment system of FIG. 1.

FIG. 2 illustrates an example of the workload simulator 112 of FIG. 1 in greater detail. In this example, the production cluster 102 is associated with hardware capabilities 202, metrics 204, and log files 206. The hardware capabilities 202 generally correspond to the memory, processing, and network transfer capacity of the production cluster 102 (i.e., of the resources 106a-c of nodes 104a-c of the production cluster 102). The metrics 204 correspond to properties or settings of the production cluster 102 and may be associated with how the cluster 102 handles various tasks. For instance, metrics 204 may include settings for how communication is configured between the nodes 104a-c of the production cluster 102 (see FIG. 1). Metrics 204 may include settings for how jobs 110a-c are allocated amongst the resources 106a-c of the production cluster 102 (e.g., settings associated with the configuration of the cluster 102). In some cases, certain of the metrics 204 may also include performance measures associated with an extent to which the resources 106a-c are expended during execution of the workload 108 (e.g., at particular times and/or by particular jobs or job types). The log files 206 generally include records of tasks performed by the production cluster 102 and provide information about jobs 110a-c (e.g., or tasks associated with these jobs 110a-c) which have been executed and/or are planned to be executed in the production cluster 102.

As described above with respect to FIG. 1, the cluster analyzer 116 of the workload simulator 112 extracts and/or determines production cluster data 122 from the production cluster 102. The production cluster data 122 may include information associated with the hardware capabilities 202, the cluster metrics 204, and/or the log files 206. FIG. 3A shows an example Table 300 of production cluster data 122 extracted by and/or determined by the cluster analyzer 116. As shown in FIG. 3A, the production cluster data 122 may include production capability information 302 such as the number of processors (or CPUs) in the production cluster 102, the number of nodes 104a-c in the production cluster 102, the memory storage space (e.g., in terabytes (TB)) of the production cluster 102, the volatile memory (e.g., the random access memory (RAM) in terabytes) of the production cluster 102, and the network bandwidth (e.g., in units of gigabytes per second (Gbps)) of the production cluster 102. In this example, the production cluster 102 includes 5000 processors, 500 nodes 104a-c, 1000 TB of disk storage space, 125 TB of RAM, and 10 Gbps of network bandwidth. This capability information 302 is generally determined based on the hardware capabilities 202 of the production cluster 102 and reflects the capabilities of the resources 106a-c of the production cluster 102.

Still referring to FIG. 3A, the production cluster data 122 may include usage information 304 associated with the usage of resources 106a-c of the production cluster 102 over time. Usage information 304 may be determined by the production cluster 102 and stored as metrics 204 and/or in log files 206. Usage information 304 may be determined by the cluster analyzer 116 based on the metrics 204 and/or log files 206. For instance, usage information 304 may be determined based on records of activity on the production cluster 102 over time found in the log files 206. Also or alternatively, usage information 304 may be determined based on measures of the percentage of total available resources 106a-c used over time found in metrics 204. The usage information 304 may include, for each of a plurality of timepoints, a maximum processor usage at the timepoint (e.g., a maximum percentage of total processor resources used at the timepoint), a disk usage at the timepoint, a maximum memory usage at the timepoint (e.g., a maximum percentage of the total memory resources used at the timepoint), and/or a maximum network usage at the timepoint (e.g., a maximum percentage of the total network bandwidth used at the timepoint).

Still referring to FIG. 3A, the production cluster data 122 may include job-wise usage information 306 associated with the usage of resources 106a-c of the production cluster 102 by different types of jobs at different timepoints. Similar to usage information 304 described above, job-wise usage information 306 may be determined by the production cluster 102 and stored as metrics 204 and/or in log files 206. Job-wise usage information 306 may be determined by the cluster analyzer 116 based on the metrics 204 and/or log files 206. The job-wise usage information 304 may include, for each of a plurality of job types and timepoints, a processor consumption for the job type and timepoint (e.g., a percentage of total processor resources used by the job type at the timepoint), a disk usage for reading data by the job type at the timepoint, a disk usage for writing data by the job type at the timepoint, a memory consumption for the job type at the timepoint (e.g., in percentage of total available memory), and/or a network usage by the job type at the timepoint (e.g., a percentage of the total network bandwidth used by the job type at the timepoint).

Turning back to FIG. 2, cluster analyzer 116 also receives test cluster data 132, which includes the hardware capabilities of the test cluster 126. FIG. 3B shows a table 350 of example test cluster capabilities 352, which may be included in the test cluster data 132. As described above with respect to FIG. 1, the test cluster 126 is generally a scaled-down version of the production cluster 102. As such, the example test cluster 126 has 500 processors, 50 nodes, 100 TB of disk storage, 10 TB of RAM, and 10 Gbps of network bandwidth, as shown in the example capabilities 352 of FIG. 3B. The test cluster capabilities 352 of the test cluster 126 are used along with the production cluster data 122 to determine which jobs to include in the simulated workload 124 generated by the workload simulator 112, as described further below.

The production cluster data 122 and the test cluster data 132 from the cluster analyzer 116 are provided to the job calculators 118a-c and used to determine jobs to include in the simulated workload 124. Each of the job calculators 118a-c may be associated with a job type. As an example, the first job calculator 118a may be associated with an Apache Spark job, and the second job calculator 118b may be associated with an Apache Sqoop job. The job calculators 118a-c may determine the test cluster load 354 and job-wise resource consumption data 356 illustrated in table 350 of FIG. 3B.

In order to determine which jobs and how many jobs to include in the simulated workload 124, the job calculator may calculate a test cluster load 354 for the test cluster 126 (see FIG. 3B). The test cluster load 354 corresponds to a scaled-down load at which to operate the test cluster 126 in order to more reliably and accurately reflect the production cluster 102 and its operating conditions than was possible using previous technology. As shown in FIG. 3B, the calculated test cluster load 354 may include a maximum processor (e.g., CPU) usage of the test cluster 126, an amount of disk memory to use during job execution, a maximum amount of memory to use during job execution, and a maximum amount of network bandwidth to use. For example, the maximum processor usage may be based on the maximum processor usage of the job-wise usage information 304 (shown in FIG. 3A) of the production cluster data 122. For instance, at 12:00 am the production cluster 102 has 60% of the maximum processor usage. The job calculators 118 determine that 300 of the total 500 processors of the test cluster 126 should be used in order to replicate resource usage of the production cluster 102 (i.e., where at most 60% of the processors of the production cluster 102 are used). Similarly, the job calculators 118a-c may determine job-wise resource consumption information 356 shown in FIG. 3B. The resource consumption information 356 corresponds to the resources which should be consumed in order to replicate different job types of the workload 108 using the test cluster 126. The example job-wise resource consumption information 356 includes, for each job type and timepoint, a processor consumption (i.e., a percentage or number of processors to use for the job), disk usage (e.g., for reading, writing, and interim tasks of the job), memory to consume by the job, and network bandwidth to use for the job.

Figure 4:
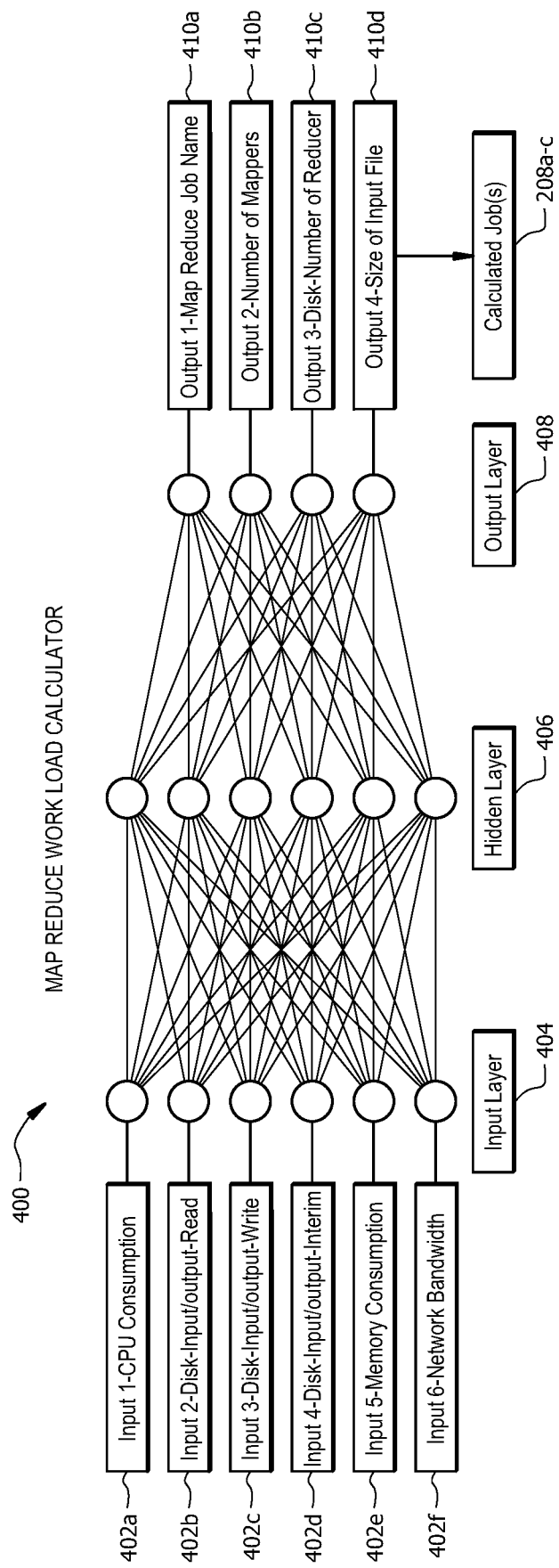
FIG. 4 is a diagram illustrating a model used to implement functions of the example workload simulators of FIGS. 1 and 2.

In some embodiments, one or more of the job calculators 118a-c is implemented using a machine learning model. For example, for each job type, a model may be trained to calculate properties of one or more jobs 208a-c to include in the simulated workload 124. Each job 208a-c may be associated with a corresponding job 110a-c of the actual workload 108. FIG. 4 illustrates an example machine learning model 400 for implementing a job calculator 118a-c. The model 400 is configured to determine a job 208a-c based on production cluster data 122 and test cluster data 132. Model 400 includes an input layer 404, a hidden layer 406 and an output layer 408. Inputs 402a-f are provided to the input layer 404. The inputs 402a-f generally include information associated with the production cluster data 122 and/or test cluster data 132 received from the cluster analyzer 116. For example, as illustrated in the example of FIG. 4, the inputs 402a-f may include job-wise usage information 306 (see FIG. 3A and corresponding description above). Inputs 402a-f may also include information about the test cluster capabilities 352 (se FIG. 3A) in order to ensure the jobs 208a-c are appropriately configured and/or the appropriate number of jobs 208a-c are included in the simulated workload 124.

The outputs 410a-d generally include properties of the jobs 208a-c to include simulated workload 124. As shown in the example of FIG. 4, the outputs 410a-d may include a job name 410a, a first job property 410b (e.g., a number of mappers to include in a map reduce job), a second job property 410c (e.g., a number of reducers to include in a map reduce job), and a file size 410d associated with the job name 410a. As described above, the job calculator model 400 may determine a number of the jobs with properties associated with outputs to include in the calculated jobs 208a-c. For example, the outputs 410a-d may include the job-wise consumption data 356 of FIG. 3B. The job-wise consumption data 356 may be used to determine the number of each job type to include in the simulated workload 124 in order to obtain calculated test cluster load 354.

The job calculator model 400 may be trained using results obtained by running a variety of different jobs and/or combinations of jobs on the test cluster 126. For example, different job types may be run with different properties (e.g., different numbers of processors, different disk space allocated to reading and writing, etc.) to determine the job-wise resource consumption information 356 shown in FIG. 3B. In some cases, information from the production cluster 102 may also or alternatively be used to train the job calculators 118.

Referring again to FIG. 2, the jobs 208a-c determined by the job calculators 118a-c are provided to the job generators 120a-c, which are coupled to the test cluster 126 and configured to cause the jobs 208a-c to be executed by the test cluster 126 as the simulated workload 124. The cluster analyzer 116, job calculators 118a-c, and job generators 120a-c of the workload simulator 112 generally facilitate the generation of an appropriately scaled-down simulated workload 124 which, when executed on the test cluster 126, accurately recreates the actual workload 108 of the production cluster 102. This allows the test cluster 126 to more accurately reflect the operating conditions of the production cluster 102 and can thereby facilitate, for example, improved tuning of the production cluster 102.

As an example, using the simulated workload 124, the test cluster 126 may identify how changes to a first job 208a affects the performance of other jobs 208b-c. For instance, the test cluster 126 may monitor resource consumption 134 so as to identify whether a change to the resources 130a-b allocated to the first job 208a negatively impacts the performance of one or more of the other jobs 208b-c. For instance, if more memory resources are allocated to the first job 208a, the test cluster 126 can determine whether the performance of the second job 208b is affected (e.g., if more resources are consumed to execute the second job 208b and/or if the second job 208b takes longer to perform). If the performance of the second job 208b is not negatively impacted by changes to the first job 208a, an analogous increase in memory may be implemented for the first job 110a at the production cluster 102.

Method of Operating a Working Simulator

Figure 5:
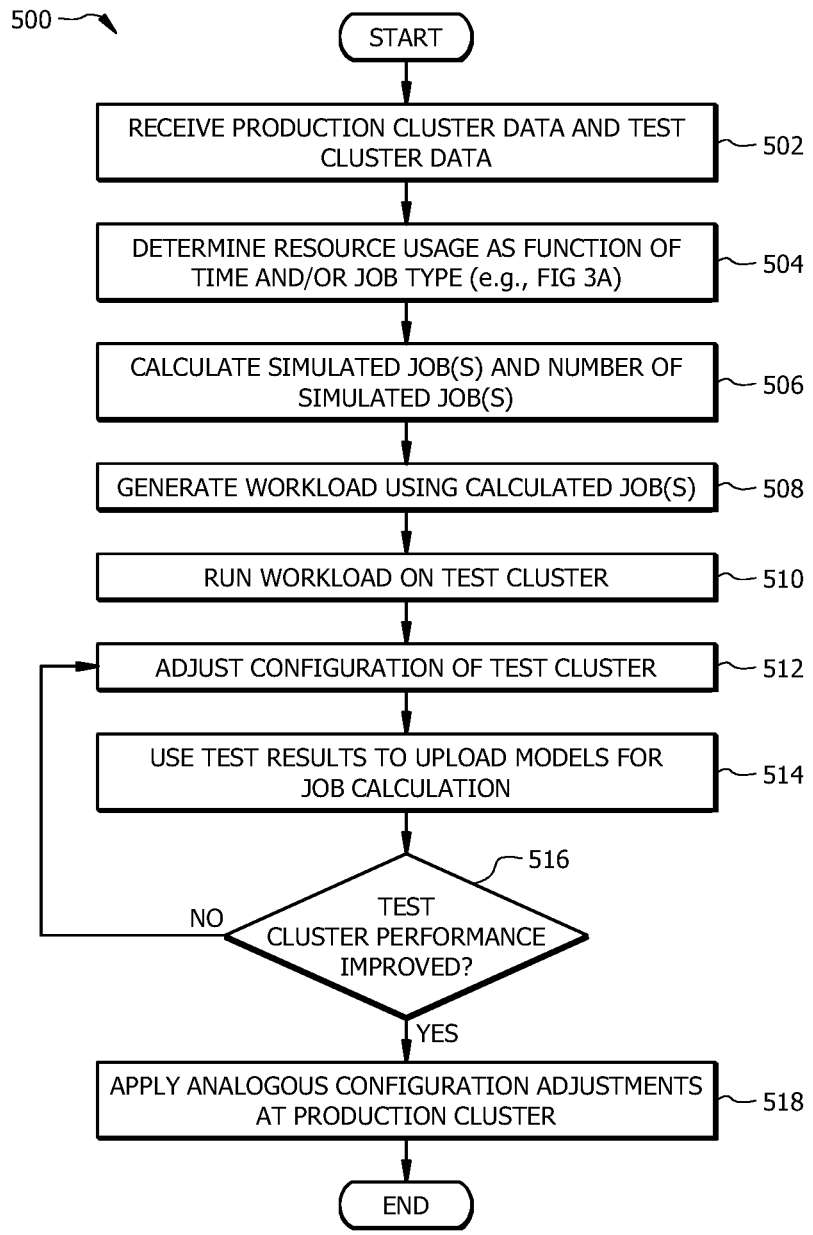
FIG. 5 is a flowchart illustrating an example method of operating the example workflow simulators of FIGS. 1 and 2.

FIG. 5 is a flowchart illustrating an example method 500 of operating the workload simulator 112 described with respect to FIGS. 1-4 above. Method 500 may begin at step 502 where production cluster data 122 and test cluster data 132 are received by the workload simulator 112. For instance, the production cluster data 122 and/or test cluster data 132 may be transmitted at intervals to the workload simulator 112. The cluster analyzer 116 may detect changes to the workload 108 and, in response, determine that a simulated workload 124 should be generated for testing. In some cases, the workload simulator 112 may monitor the production cluster 102 and detect when there is a change to workload 108 or a change in performance (e.g., an increase in resource consumption) of the production cluster 102. In response, the workload simulator 112 may determine that a simulated workload 124 should be generated corresponding to the changed workload 108. This simulated workload 124 can be provided to the test cluster 126 to determine a more appropriate configuration for efficiently executing the workload 108, as described below. In some cases, a request may be received (e.g., from an administrator 156) to generate a simulated workload 124 for testing at the test cluster 126.

At step 504, the workload simulator 112 determines resource usage as a function of time and job type. In other words, the workload simulator 112 determines the cluster usage information 304 and job-wise usage information 306, described above with respect to FIG. 3A. For example, the job calculators 118 may use information about the hardware capabilities 202, metrics 204, and/or log files 206 of the production cluster 102 to determine the cluster usage information 304 and job-wise information 306.

At step 506, the workload simulator 112 determines jobs 208a-c to include in the simulated workload 124. For instance, a job calculator 118a associated with a first job type (e.g., an Apache Spark job) may determine whether a one of jobs 110a-c of workload 108 are of the same type. If there is a job 110a-c of the same type, the job calculator 118a will then determine how many jobs 208a of this type to include in the simulated workload 124. This determination, for example, may be based on the test cluster load 354 and job-wise resource consumption data 356 described above with respect to FIG. 3B. A second job calculator 118b will similarly determine whether jobs of a second type (e.g., Apache Sqoop jobs) are included in the workload 108. If such jobs are not included in the workload 108, jobs 208b of this type will generally not be included in the simulated workload 124. The total number of each of the jobs 208a-c included in the simulated workload 124 is generally selected such that the total resources consumed by all jobs 208a-c meets the test cluster load 354 for the test cluster 126 to reflect operation of the production cluster 102.

At step 508, the workload simulator 112 generates the simulated workload 124 based on the jobs 208a-c determined at step 506. The simulated workload 124 includes jobs 208a-c. At step 510, the workload simulator 112 causes the workload 124 to be executed (e.g., "run") on the test cluster 126. For example, the workload simulator 112 may transmit the simulated workload 124 to the test cluster 126 along with instructions to execute the simulated workload 124. The test cluster 126 then executes the simulated workload 124 and maintains a record of resource consumption 134, which corresponds to the amount of resources 130a-b used while running the simulated workload 124.

In some cases, the method may include further steps, such as steps 512 to 518 described below, for tuning the production cluster 102 based on results of tests performed at the test cluster 126. For instance, at step 512, the test cluster 126 may receive instructions to adjust the configuration of the test cluster 126. An adjustment to the configuration of the test cluster 126 generally corresponds to changing how jobs 208a-c of the simulated workload 124 are allocated amongst resources 130a-b of the test cluster 126. For example, the amount of memory allocated to a first job 208a may be increased, and the test cluster 126 may determine how this increase affects the performance of the test cluster 126 (e.g., based on changes in resource consumption 134).

At step 514, the results of these tests may be used to update models used in the workload simulator 126. For example, the results (e.g., changes in resource consumption 134 in response to a configuration change at the test cluster 126) may be used to train models used to implement the job calculators 118, for example, as described with respect to FIG. 4 above.

At step 516, a determination is made, for a given adjustment to the test cluster 126, of whether the performance of the test cluster 126 improved. For instance, the test cluster 126 may determine whether the overall resource consumption 134 of the cluster decreased or increased as a result of the change in configuration. For example, the test cluster 126 may determine if the time required to perform other jobs 208a-c is increased. If performance increases (or remains the same), analogous configuration changes may be implemented at the production cluster 102 at step 518. For instance, if increasing the memory allocated to a first job 208a at the test cluster 126 improves performance of the test cluster 102, a similar increase in memory allocation may be executed for an analogous job 110a at the production cluster 102. In some embodiments, steps 516 and 518 or certain portions of these steps may be performed using the cluster tuner 140, described above with respect to FIG. 1 and below with respect to FIGS. 6 and 7.

Cluster Tuner

Figure 6:
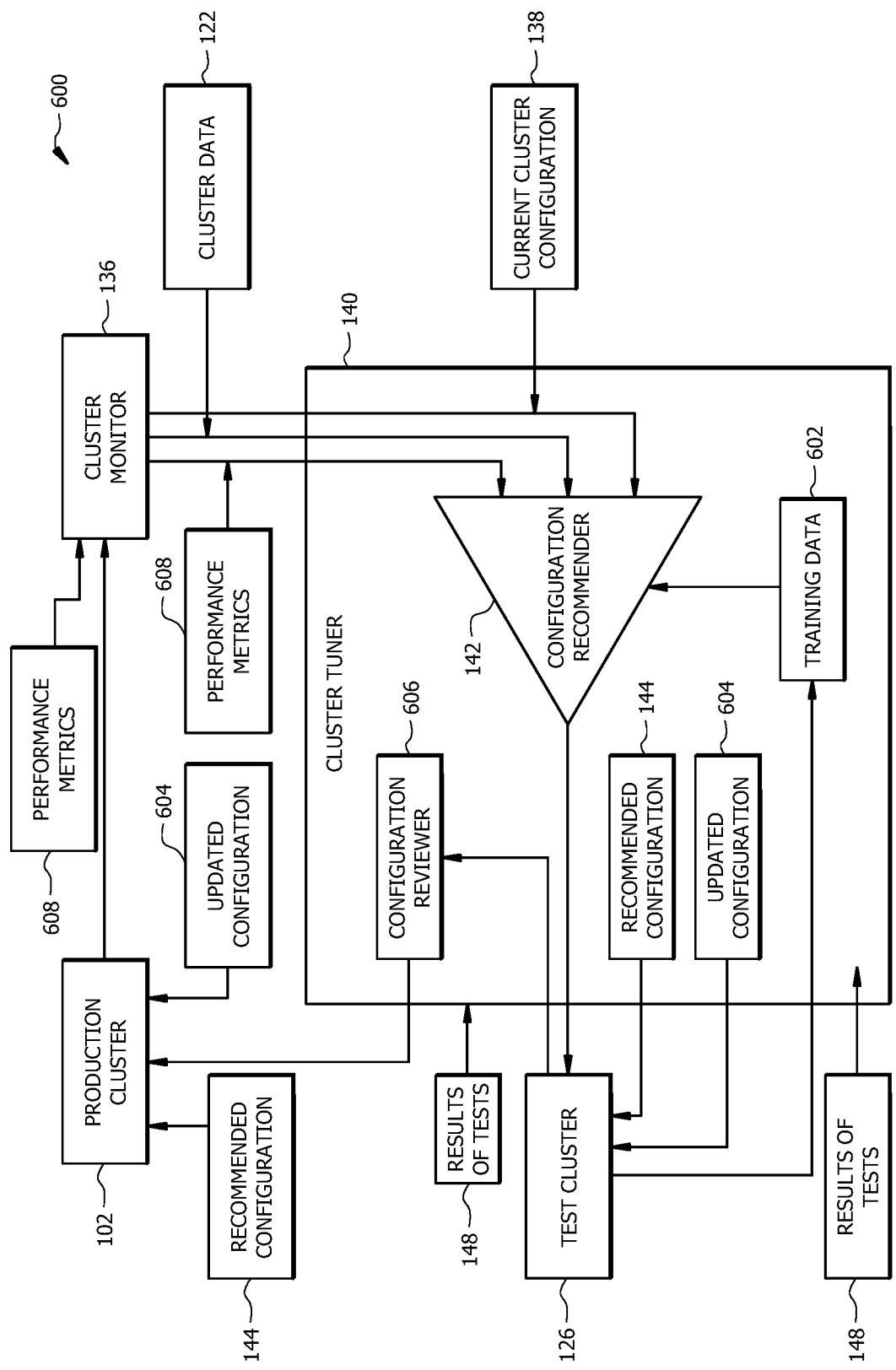
FIG. 6 is a diagram illustrating an example cluster tuner for use in the cluster environment of FIG. 1.

FIG. 6 illustrates an example of the cluster tuner 140 of FIG. 1 in greater detail. The cluster tuner 140 includes the configuration recommender 142 which receives information (e.g., including the production cluster data 122 and cluster configuration 138) from the cluster monitor 136 and uses this information to generate a recommended configuration 144 for the production cluster 102. The recommended configuration 144 may be determined based on training data 602, which generally includes a record of results 148 of tests run on the test cluster 126. For instance, the cluster tuner 140 may identify a first job 110a of a first type (e.g., an apache Spark job) and a second job 110b of a second job type (e.g., an Apache Sqoop job) in the workload 108. In some cases, a recommended configuration 144 corresponds to allocating additional memory resources to at least one of the jobs 110a-c and allocating additional processing resources to at least one of the jobs 110a-c. For example, memory allocated to job 110a may be increased while processing resources allocated to job 110b are increased.

As shown in the example of FIG. 6, the recommended configuration 144 may be transmitted to the test cluster 126. The test cluster may execute a workload using the recommended configuration 144. In some cases, the workload executed by the test cluster may be a simulated workload 124, as described above with respect to FIGS. 1-5. The results 148 of using the recommended configuration 144 may be provided to the cluster tuner 140 in order to determine whether the recommended configuration 144 should be implemented in the production cluster 102. For example, the cluster tuner 140 may include a configuration reviewer 606 configured to receive the results 148 and determine, based on the results 148, whether the recommended configuration 144 should be implemented in the production cluster 102. For example, in response to determining that the recommended configuration 144 resulted in a decrease in resource consumption 134 by the test cluster 126, the configuration reviewer 606 may determine that the recommended configuration 144 should be implemented by the production cluster 102. If the recommended configuration 144 results in an improved performance of the test cluster 126 (e.g., faster execution of workload 124 and/or execution of workload 124 while consuming fewer resources 130a-b), the recommended configuration 144 may be provided to the production cluster 102 for implementation such that the jobs 110a-c of workload 108 are allocated amongst resources 106a-c according to the recommended configuration 144.

However, if the recommended configuration 144 results in an increase in resource consumption 134 (e.g., in decreased performance of the test cluster 126), the configuration reviewer 606 may determine that the recommended configuration 144 should not be implemented by the production cluster 102. In such cases, the configuration recommender 142 may determine a different recommended configuration 604. For example, the configuration recommender 142 may generate a list of possible configurations to implement in the production cluster 102, and the configurations may be given a score corresponding to the probability that the configuration will improve cluster performance. The first attempted configuration 144 may have the highest score, and the second configuration 604 may have the next highest score. the new configuration 604 may be tested using the test cluster 126, as described above for the original recommended configuration 144. If the updated configuration 604 results in an improvement to performance (e.g., a decrease in resource consumption 134) of the test cluster 126, the updated configuration 604 may be provided to the production cluster 102 for implementation. The jobs 110a-c of workload 108 may be allocated to the resources 106a-c according to the updated configuration 604.

Following implementation of the recommended configuration 144 (or the updated configuration 604) at the production cluster 102, the cluster monitor 136 may monitor performance of the production cluster 102. For instance, following operation of the production cluster 102 according to the recommended configuration 144, the cluster monitor 136 may monitor performance metrics 608 of the production cluster 102. The performance metrics 608 may include measures of computing resources consumed by the production cluster 102. If the performance metrics 608 indicate that resource consumption by the production cluster 102 is increased during operation according to the recommended configuration 144, the cluster tuner 140 may cause the production cluster 102 to revert back to the previous configuration (i.e., to the configuration used before the recommended configuration 144 or updated configuration 604 was implemented). In some cases, rather than reverting to a previous configuration, the configuration recommender 142 may determine an updated configuration 604 according to which the production cluster 102 may be operated, as described above. Accordingly, by continuing to monitor performance of the production cluster 102, the system 100 may prevent changes to the cluster configuration from being permanently implemented when these changes result in decreased cluster performance.

Method of Operating a Cluster Tuner

Figure 7:
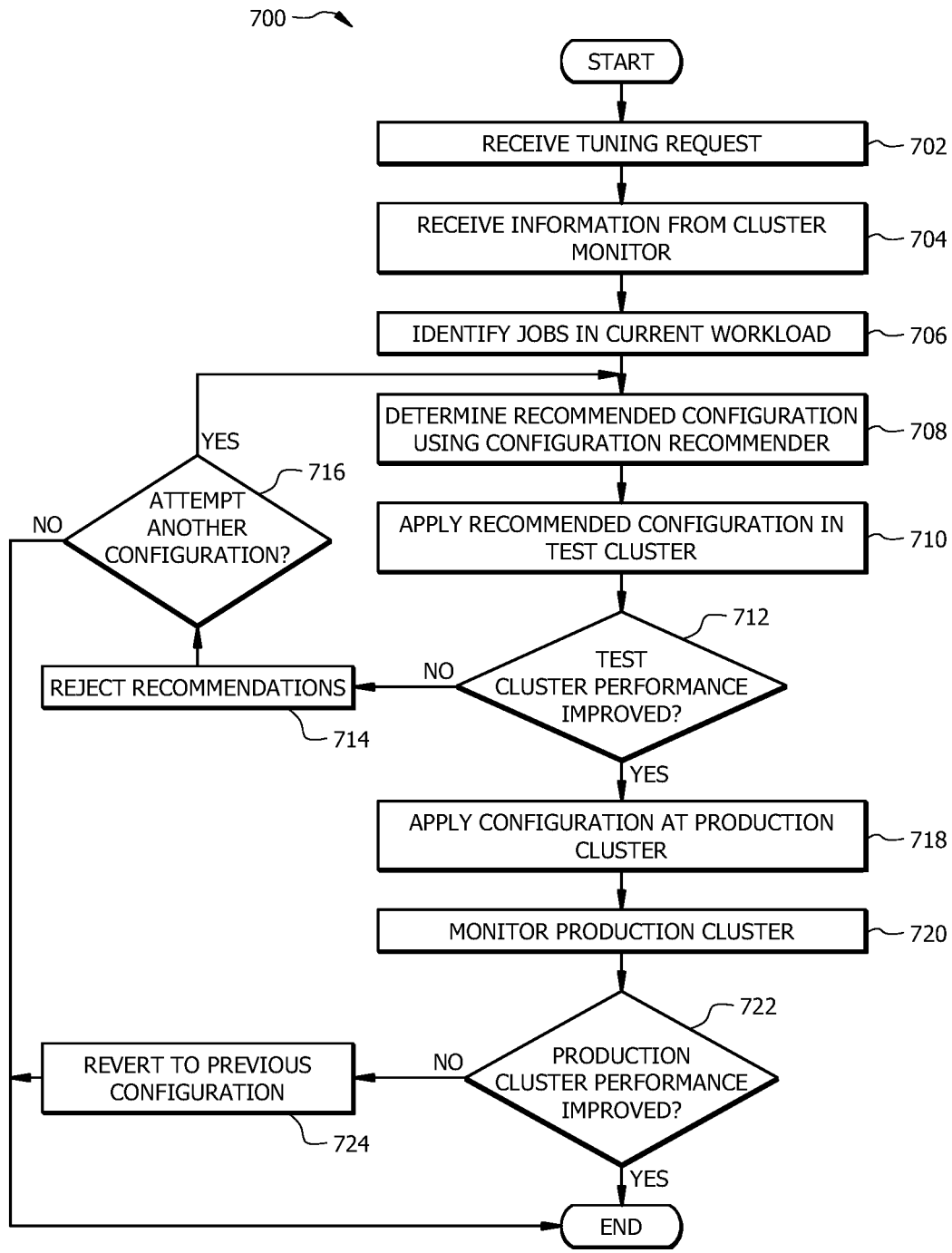
FIG. 7 is a flowchart illustrating an example method of operating the example cluster tuners of FIGS. 1 and 6.

FIG. 7 is a flowchart illustrating an example method 700 of operating the cluster tuner 140. Method 700 generally facilitates improved operation of the production cluster 102 by determining a recommended configuration 144 for efficiently allocating jobs 110a-c amongst resources 106a-c of the production cluster 102. In some cases the recommended configuration 144 is first tested on the test cluster 126 to determine whether the recommended configuration 144 performance of the test cluster 126 before the configuration 144 is implemented at the production cluster 102.

At step 702, a tuning request 158 is received by the cluster tuner 140. For example, an administrator 156 may send a request via device 154 to tune operation of the production cluster 102. The request 158 may be associated with improving performance of current workload 108 or based on anticipated changes to the workload 108.

At step 704, the cluster tuner 140 receives information about the production cluster 102. The information may include the production cluster data 122, cluster configuration information 138, and/or cluster performance metrics 608 described above with respect to FIGS. 1 and 6. For example, the cluster monitor 136 may extract production cluster information that includes a record of the computing resources 106a-c of nodes 104a-c of the production cluster 102 and a record of the jobs 110a-c associated with the workload 108 (e.g., production cluster data 122) and transmit this information to the cluster tuner 140. The cluster monitor may also monitor configuration information 138 (e.g., during execution of the workload 108 on the production cluster 102). As described above, the configuration information 138 may corresponding to how jobs 110a-c are allocated amongst the computing resources 106a-c of the production cluster of the production cluster 102. The configuration information 138 may be provided to the cluster tuner 140.

At step 706, the cluster tuner 102 may identify the jobs 110a-c in the workload 108 being executed on the production cluster 102. As an example, the jobs 110a-c may include one or more Apache Spark jobs, Apache Sqoop jobs, Apache Impala jobs, or the like. At step 708, the cluster tuner 140 determines a recommended configuration 144 to implement in the production cluster 102 (e.g., using configuration recommender 142, as described above with respect to FIG. 6). For example, the cluster recommender 142 may identifying a first job 110a of a first type (e.g., an Apache Spark job) and a second job 110b of a second type (e.g., an Apache Sqoop job) in the workload 108. The configuration recommender 142 may determine a first amount of computing resources 106a-c to allocate to the first job 110a and a second amount of computing resources to allocate to the second job 110b. For instance, the first job type may be pre-associated (e.g., via one or more tables stored in the cluster tuner 140) with having an improved performance when more memory resources are available, and the second job type may be associated with having improved performance when additional processing resources are available, In an example case, the cluster tuner 140 may allocate additional memory resources 106a-c to the first job 110a and allocate additional processing resources to the second job 110b. In some embodiments, the cluster recommender employ a machine learning model which is trained using training data 602 to determine a recommended configuration 144 based on information from the cluster tuner 136.

At step 710, the recommended configuration is implemented at the test cluster 126. For example, jobs of a simulated workload 124 executed at the test cluster 126 may be allocated according to the recommend configuration 144 amongst the resources 130a-b of the test cluster 126. At step 712, the test cluster 140 determines whether the recommended configuration improves performance of the test cluster 126 (e.g., compared to performance of a previous configuration). For instance, may determine whether resource consumption 134 is increased or decreased after implementing the recommended configuration 144. An increase in resource consumption 134 generally corresponds to a decrease in performance, while a decrease in resource consumption 134 generally corresponds to an increase in performance.

If, at step 712, the cluster tuner 140 determines that performance is not increased, the recommendation 144 is generally rejected at step 714. At step 716, the cluster tuner 140 determines whether to attempt another configuration. For example, the cluster tuner 140 may be pre-configured (e.g., by administrator 156) to attempt a predetermined number of configurations to improve performance of the production cluster 102 before the tuning process ends. If the cluster tuner 140 is configured to attempt another configuration, the cluster tuner 140 may return to step 708 to determine an updated configuration 604. For example, the configuration recommender 142 may generate a list of possible configurations to implement in the production cluster 102, and the configurations may be given a score corresponding to the probability that the configuration is anticipated improve cluster performance. The first attempted configuration 144 may have the highest score, and the second configuration 604 may have the next highest score. If, at step 716, the cluster tuner 140 determines that no further configurations should be attempted, the method 700 ends.

If, at step 712, the cluster tuner 140 determines that the performance of the test cluster 126 is improved (e.g., if resource consumption 134 is decreased), the cluster tuner 140 may cause the recommended configuration 144 (or updated configuration 604) to be implemented at the production cluster 102 at step 718. For example, the cluster tuner 140 may transmit the recommended configuration 144 to the production cluster 102, and the production cluster 102 may be configured to implement the configuration 144 by adjusting how jobs 110a-c of the workload 108 are allocated amongst the resources 106a-c of the production cluster 102.

At step 720, the production cluster 102 may be monitored. For instance, the cluster monitor 136 may monitor performance metrics 608 of the production cluster 102, as described above with respect to FIG. 6. The performance metrics 608 may be provided to the cluster tuner 140. As described above, the performance metrics 608 may include measures of computing resources consumed by the production cluster 102. At step 722, the cluster tuner 140 may use the performance metrics 608 to determine whether the performance of the production cluster 102 is improved. If the performance is not improved (e.g., or if the performance becomes poorer, for example, through an increase in the consumption of computing resources of the production cluster 102), the method 700 may proceed to step 724, and the production cluster 102 may be reverted to its previous configuration. By continuing to monitor performance of the production cluster 102 at step 720, changes to the cluster configuration which result in poorer performance are not permanently implemented at the production cluster 102.

Example Devices for Implementing the Application Deployment System

Figure 8:
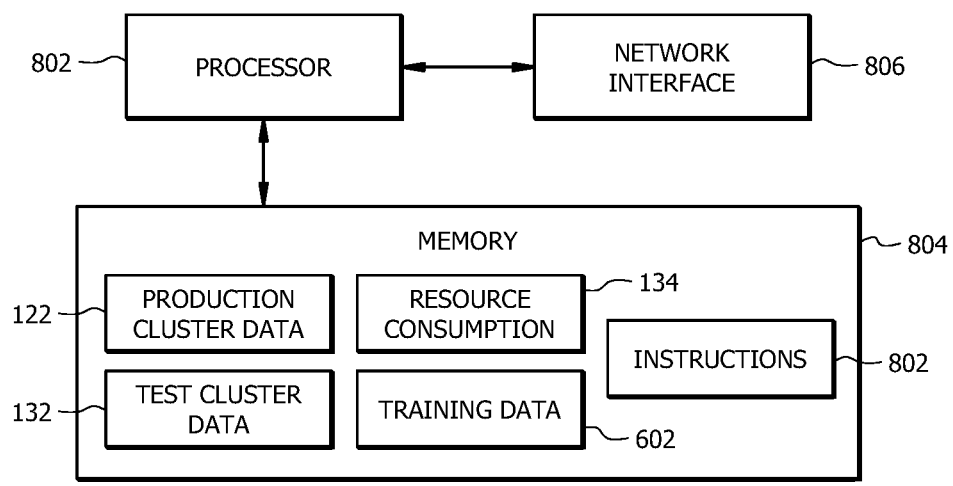
FIG. 8 is diagram illustrating an example device configured to implement the example cluster environment system of FIG. 1.

FIG. 8 is an embodiment of a device 800 configured to implement the cluster environment system 100, illustrated in FIG. 1. The device 800 includes a processor 802, a memory 804, and a network interface 806. The device 800 may be configured as shown or in any other suitable configuration. The device 800 may be and/or may be used to implement any one or more of the production cluster 102, the workload simulator 112, the test cluster 126, the cluster monitor 136, the cluster tuner 140, and devices 150a-b, 154 of FIG. 1.

The processor 802 includes one or more processors operably coupled to the memory 804. The processor 802 is any electronic circuitry including, but not limited to, state machines, one or more central processing unit (CPU) chips, logic units, cores (e.g. a multi-core processor), field-programmable gate array (FPGAs), application specific integrated circuits (ASICs), or digital signal processors (DSPs). The processor 802 may be a programmable logic device, a microcontroller, a microprocessor, or any suitable combination of the preceding. The processor 802 is communicatively coupled to and in signal communication with the memory 804 and the network interface 806. The one or more processors are configured to process data and may be implemented in hardware or software. For example, the processor 802 may be 8-bit, 16-bit, 32-bit, 64-bit or of any other suitable architecture. The processor 802 may include an arithmetic logic unit (ALU) for performing arithmetic and logic operations, processor registers that supply operands to the ALU and store the results of ALU operations, and a control unit that fetches instructions from memory and executes them by directing the coordinated operations of the ALU, registers and other components. The one or more processors are configured to implement various instructions. For example, the one or more processors are configured to execute instructions to implement the function disclosed herein, such as some or all of method 300. In an embodiment, the function described herein is implemented using logic units, FPGAs, ASICs, DSPs, or any other suitable hardware or electronic circuitry.

The memory 804 is operable to production cluster data 122, test cluster data 132, resource consumption data 134, training data 602, and/or any other data or instructions 808. The memory 804 includes one or more disks, tape drives, or solid-state drives, and may be used as an over-flow data storage device, to store programs when such programs are selected for execution, and to store instructions and data that are read during program execution. The memory 804 may be volatile or non-volatile and may include read-only memory (ROM), random-access memory (RAM), ternary content-addressable memory (TCAM), dynamic random-access memory (DRAM), and static random-access memory (SRAM).

The production cluster data 122, test cluster data 132, resource consumption data 134, and training data 602 are described above with respect to FIGS. 1, 2, and 6. The instructions 808 may include any suitable set of logic, rules, or code operable to execute the function described in this disclosure. For instance, the instructions 808 may include any suitable set of logic, rules, or code to implement function of the workload simulator 112 including the cluster analyzer 116, the job calculators 118, and the job generators 120 (see, e.g., FIGS. 1 and 2). As another example, the instructions 808 may include any suitable set of logic, rules, or code to implement function of the cluster tuner 140 including the configuration recommender 142 and the configuration reviewer 606 (see, e.g., FIGS. 1 and 6).

The network interface 806 is configured to enable wired and/or wireless communications (e.g., via a network). The network interface 806 is configured to communicate data between the device 800 and other network devices, systems, or domain(s). For example, the network interface 806 may include a WIFI interface, a local area network (LAN) interface, a wide area network (WAN) interface, a modem, a switch, or a router. The processor 802 is configured to send and receive data using the network interface 806. The network interface 806 may be configured to use any suitable type of communication protocol as would be appreciated by one of ordinary skill in the art.

While several embodiments have been provided in the present disclosure, it should be understood that the disclosed systems and methods might be embodied in many other specific forms without departing from the spirit or scope of the present disclosure. The present examples are to be considered as illustrative and not restrictive, and the intention is not to be limited to the details given herein. For example, the various elements or components may be combined or integrated in another system or certain features may be omitted, or not implemented.

In addition, techniques, systems, subsystems, and methods described and illustrated in the various embodiments as discrete or separate may be combined or integrated with other systems, modules, techniques, or methods without departing from the scope of the present disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

To aid the Patent Office, and any readers of any patent issued on this application in interpreting the claims appended hereto, applicants note that they do not intend any of the appended claims to invoke 35 U.S.C. § 112(f) as it exists on the date of filing hereof unless the words "means for" or "step for" are explicitly used in the particular claim.

What is claimed is:

1. A system comprising:
a production cluster comprising a first plurality of nodes, the production cluster configured to execute a workload, wherein jobs associated with the executed workload are allocated, according to a first configuration, across the first plurality of nodes;
a workload simulator coupled to the production cluster and a test cluster, the workload simulator implemented by a processor, wherein the processor is configured to:
extract, from the production cluster, production cluster data comprising: production capability information comprising a record of computing resources associated with the plurality of nodes of the production cluster;
workload data comprising a record of the jobs associated with the workload; and
production cluster usage information comprising a record of usage, over time, of the computing resources associated with the plurality of nodes of the production cluster by the jobs associated with the workload;
extract, from the test cluster, test capability information comprising a record of computing resources available to the test cluster;
determine, based at least in part on the production cluster data, a first job type of the jobs associated with the workload to include in a simulated workload to be executed on the test cluster;
determine, based at least in part on the production capability information and the test capability information, a number of jobs of the first job type to include in the simulated workload; and
generate the simulated workload comprising the determined number of jobs of the first job type; and the test cluster comprising a second plurality of nodes, wherein the second plurality of nodes comprises fewer nodes than the first plurality of nodes, the test cluster executes the simulated workload.

2. The system of claim 1, the test cluster further configured to:
allocate, according to a second configuration, the simulated workload across the second plurality of nodes of the test cluster;
execute the simulated workload allocated according to the second configuration;
following executing the simulated workload allocated according to the second configuration, determine that computing resource consumption is increased in the test cluster; and
in response to determining that computing resource consumption is increased, prevent allocation of the workload according to the second configuration on the production cluster.

3. The system of claim 1, the test cluster further configured to:
allocate, according to a third configuration, the simulated workload across the second plurality of nodes of the test cluster;
execute the simulated workload allocated according to the third configuration;
following executing the simulated workload allocated according to the third configuration, determine that computing resource consumption is decreased in the test cluster; and
in response to determining that computing resource consumption is decreased, allow allocation of the workload according to the third configuration on the production cluster.

4. The system of claim 3, further comprising a cluster tuner configured to cause the production cluster to allocate the workload according to the third configuration.

5. The system of claim 1, the processor configured to:
identify a first job of a first job type executed on the production cluster;
determine a first amount of computing resources expended executing the first job on the production cluster;
determine a second job of the first type to execute on the test cluster;
determine a second amount of computing resources expended executing the second job on the test cluster;
determine, based on a first comparison of the production capability information and the test capability information and a second comparison of the first amount to the second amount, a number of the second jobs to execute on the test cluster in order to reflect resource consumption associated with the first job type on the production cluster; and
add the number of the second jobs to the simulated workload.

6. The system of claim 1, wherein the simulated workload is generated based on a time at which the workload is executed on the production cluster.

7. The system of claim 1, wherein a first number of nodes of the production cluster is at least ten times larger than a second number of nodes of the test cluster.

8. A method comprising: extracting, from a production cluster, production cluster data, wherein the production cluster comprises a first plurality of nodes and is configured to execute a workload, wherein jobs associated with the workload are allocated, according to a first configuration, across the first plurality of nodes, wherein the production cluster data comprises: production capability information comprising a record of computing resources associated with the plurality of nodes of the production cluster; workload data comprising a record of the jobs associated with the workload; and production cluster usage information comprising a record of usage, over time, of the computing resources associated with the plurality of nodes of the production cluster by the jobs associated with the workload; extracting test capability information comprising a record of computing resources available to a test cluster, the test cluster comprising a second plurality of nodes, wherein the second plurality of nodes comprises fewer nodes than the first plurality of nodes; determining, based at least in part on the production cluster data, a first job type of the jobs associated with the workload to include in a simulated workload to be executed on the test cluster; determining, based at least in part on the production capability information and the test capability information, a number of jobs of the first job type to include in the simulated workload; generating the simulated workload comprising the determined number of jobs of the first job type; and executing, by the test cluster, the simulated workload.

9. The method of claim 8, further comprising:
allocating, according to a second configuration, the simulated workload across the second plurality of nodes of the test cluster;
executing the simulated workload allocated according to the second configuration;
following executing the simulated workload allocated according to the second configuration, determining that computing resource consumption is increased in the test cluster; and
in response to determining that computing resource consumption is increased, prevent allocation of the workload according to the second configuration on the production cluster.

10. The method of claim 8, further comprising:
allocating, according to a third configuration, the simulated workload across the second plurality of nodes of the test cluster;
executing the simulated workload allocated according to the third configuration;
following executing the simulated workload allocated according to the third configuration, determining that computing resource consumption is decreased in the test cluster; and
in response to determining that computing resource consumption is decreased, allowing allocation of the workload according to the third configuration on the production cluster.

11. The method of claim 10, further comprising a cluster tuner configured to cause the production cluster to allocate the workload according to the third configuration.

12. The method of claim 8, further comprising:
identifying a first job of a first job type executed on the production cluster;
determining a first amount of computing resources expended executing the first job on the production cluster;
determining a second job of the first type to execute on the test cluster;
determining a second amount of computing resources expended executing the second job on the test cluster;
determining, based on a first comparison of the production capability information and the test capability information and a second comparison of the first amount to the second amount, a number of the second jobs to execute on the test cluster in order to reflect resource consumption associated with the first job type on the production cluster; and
adding the number of the second jobs to the simulated workload.

13. The method of claim 8, further comprising generating the simulated workload based on a time at which the workload is executed on the production cluster.

14. The method of claim 8, wherein a first number of nodes of the production cluster is at least ten times larger than a second number of nodes of the test cluster.

15. A device configured to generate a simulated workload associated with a workload executed on a production cluster, the device comprising: a memory configured to store instructions; and one or more processors coupled to the memory and a network interface, the one or more processors configured, when executing the instructions, to: extract, from the production cluster, production cluster data, the production cluster comprising a first plurality of nodes and configured to execute a workload, wherein jobs associated with the executed workload are allocated, according to a first configuration, across the first plurality of nodes, wherein the production cluster data comprises: production capability information comprising a record of computing resources associated with the plurality of nodes of the production cluster; workload data comprising a record of the jobs associated with the workload; and production cluster usage information comprising a record of usage, over time, of the computing resources associated with the plurality of nodes of the production cluster by the jobs associated with the workload; extract, from a test cluster, test capability information comprising a record of computing resources available to the test cluster, the test cluster comprising a second plurality of nodes, wherein the second plurality of nodes comprises fewer nodes than the first plurality of nodes, the test cluster configured to execute the simulated workload; determine, based at least in part on the production cluster data, a first job type of the jobs associated with the workload to include in the simulated workload to be executed on the test cluster; determine, based at least in part on the production capability information and the test capability information, a number of jobs of the first job type to include in the simulated workload; generate the simulated workload comprising the determined number of jobs of the first job type; and execute, by the test cluster, the simulated workload.

16. The device of claim 15, the one or more processors further configured to:
allocate, according to a second configuration, the simulated workload across the second plurality of nodes of the test cluster;
cause the test cluster to execute the simulated workload allocated according to the second configuration;
following causing the test cluster to execute the simulated workload allocated according to the second configuration, determine that computing resource consumption is increased in the test cluster; and
in response to determining that computing resource consumption is increased, prevent allocation of the workload according to the second configuration on the production cluster.

17. The device of claim 15, the one or more processors further configured to:
allocate, according to a third configuration, the simulated workload across the second plurality of nodes of the test cluster;
cause the test cluster to execute the simulated workload allocated according to the third configuration;
following executing the simulated workload allocated according to the third configuration, determine that computing resource consumption is decreased in the test cluster; and
in response to determining that computing resource consumption is decreased, cause the production cluster to allocate the workload according to the third configuration.

18. The device of claim 15, the one or more processors further configured to:
identify a first job of a first job type executed on the production cluster;
determine a first amount of computing resources expended executing the first job on the production cluster;
determine a second job of the first type to execute on the test cluster;
determine a second amount of computing resources expended executing the second job on the test cluster;

determine, based on a first comparison of the production capability information and the test capability information and a second comparison of the first amount to the second amount, a number of the second jobs to execute on the test cluster in order to reflect resource consumption associated with the first job type on the production cluster; and add the number of the second jobs to the simulated workload.

19. The device of claim 15, wherein the simulated workload is generated based on a time at which the workload is executed on the production cluster.

20. The device of claim 15, wherein a first number of nodes of the production cluster is at least ten times larger than a second number of nodes of the test cluster.

* * * * *